United States Patent [19]

Teyler

[11] 4,151,462

[45] Apr. 24, 1979

[54] ELECTRICAL TEST PROBE HAVING A SPRING BIASED CLIP WITH AN EXTENDABLE AND RETRACTABLE TIP MOVABLE WITHIN THE CLIP

[76] Inventor: A. Lee Teyler, 319 Foster La., Billings, Mont. 59101

[21] Appl. No.: 787,043

[22] Filed: Apr. 13, 1977

[51] Int. Cl.² ............................................. G01R 31/02
[52] U.S. Cl. ................................. 324/72.5; 339/31 T; 339/108 TP; 339/261
[58] Field of Search .............................. 324/72.5, 149; 339/32 M, 32 R, 108 TP, 261, 31 T

[56] References Cited

U.S. PATENT DOCUMENTS

| | | | |
|---|---|---|---|
| 2,918,646 | 12/1959 | Davidson | 339/31 T |
| 3,821,689 | 6/1974 | Graham | 339/261 |

Primary Examiner—Robert J. Corcoran
Attorney, Agent, or Firm—Cahill, Sutton & Thomas

[57] ABSTRACT

A normally retracted tip is extendible intermediate spring biased jaws of an electrical probe and is retained in the extended position by a spring bias and the gripping action of the jaws. The housing for the probe includes a compartment for containing interchangeable active or passive circuitry operative upon the signal sensed by the probe or a signal injected thereto from the probe. Apparatus for checking the electrical continuity through the probe is also disposed within the housing. A socket which provides both electrical and structural interconnection between the probe and an attached electrical conductor(s) is disposed at the rear of the housing.

19 Claims, 10 Drawing Figures

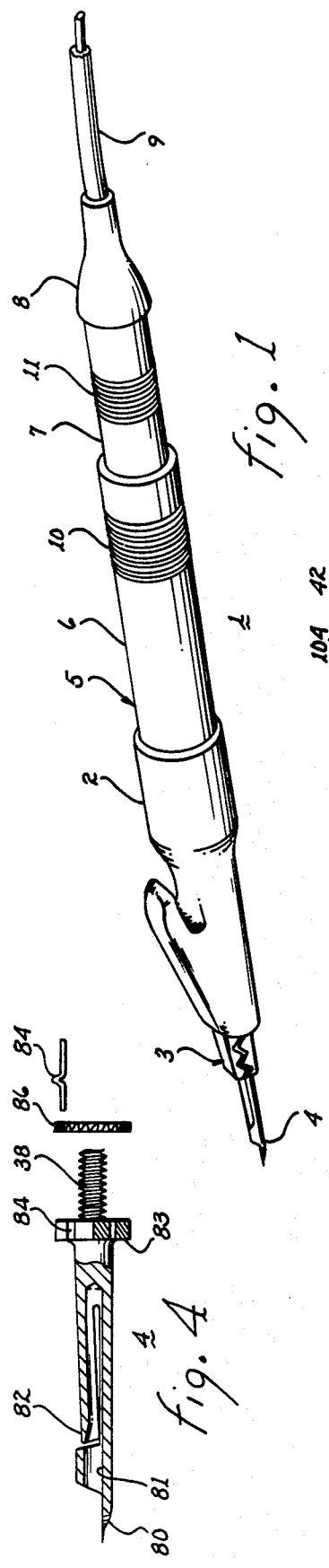
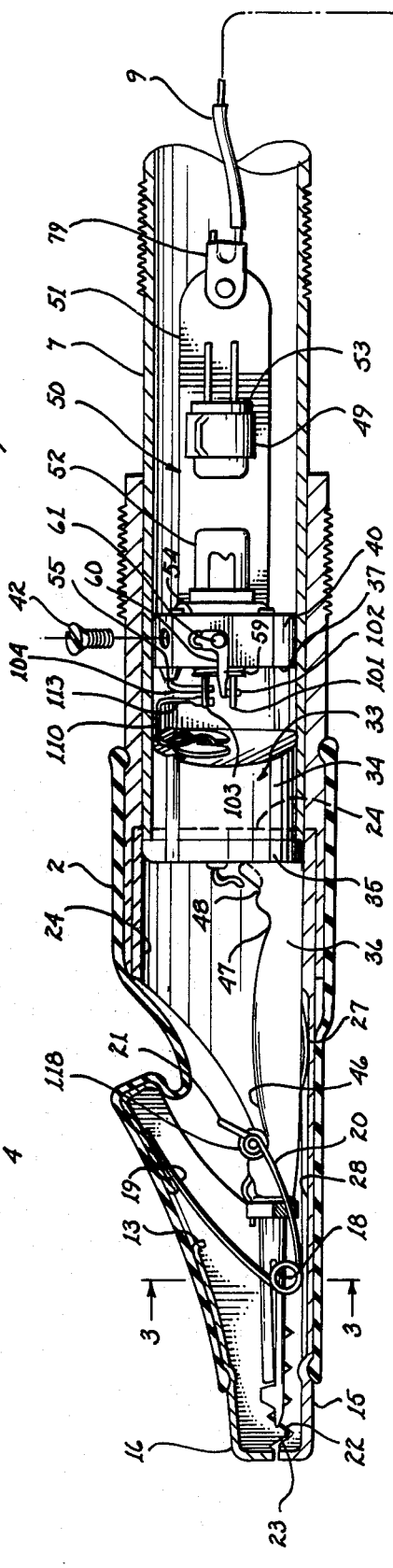
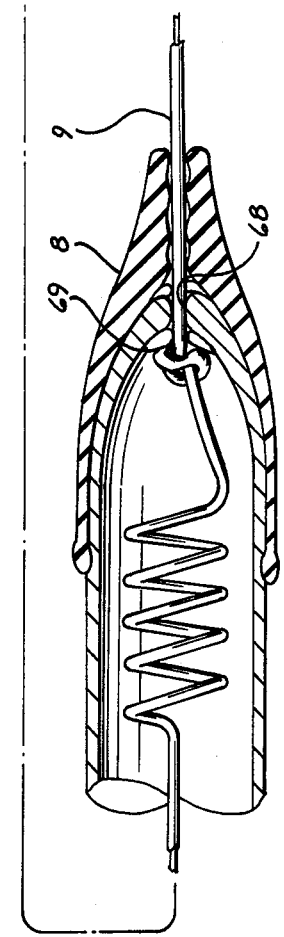
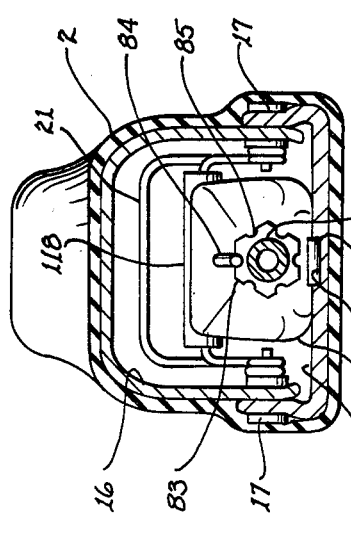
fig. 1
fig. 2
fig. 3
fig. 4

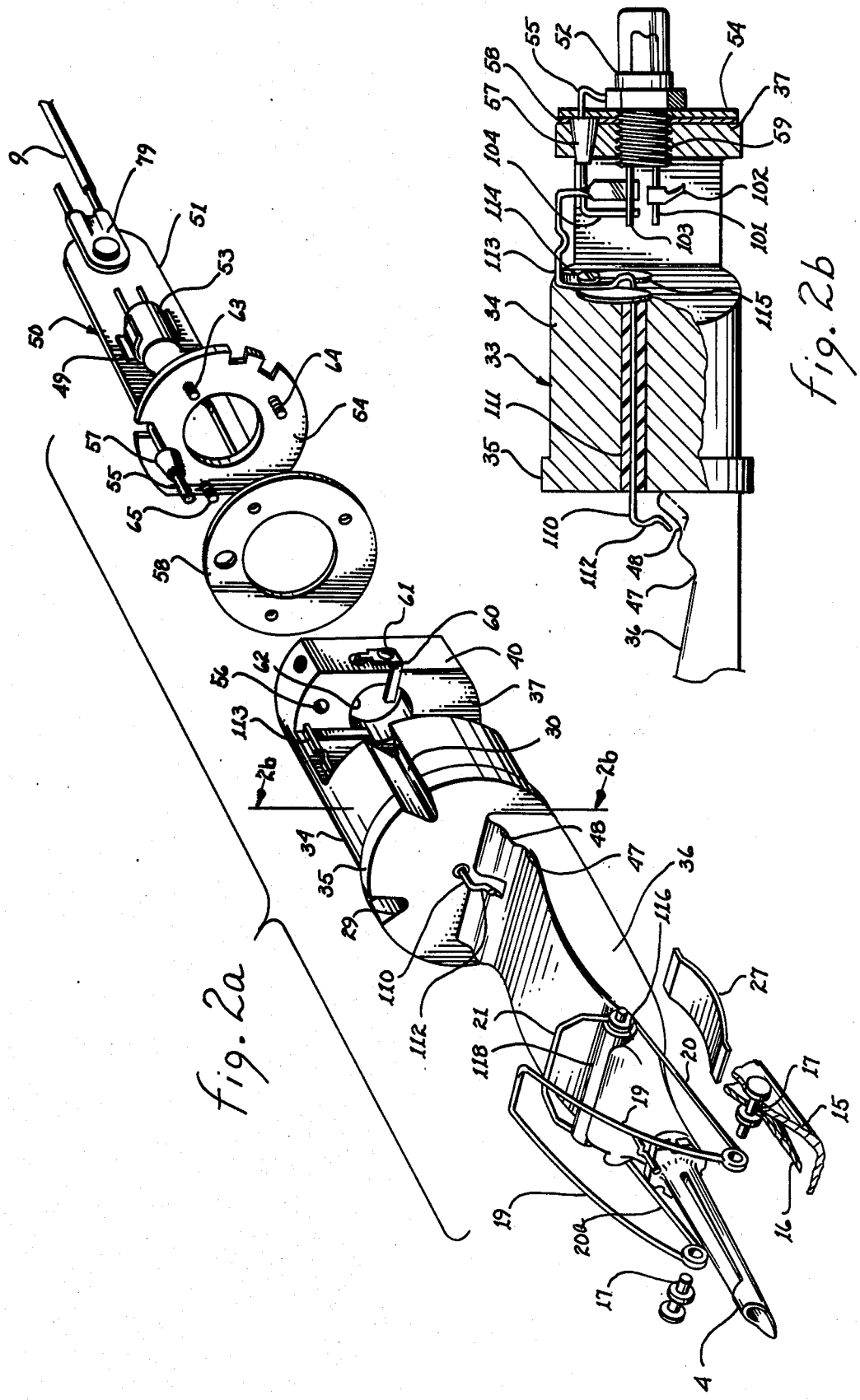

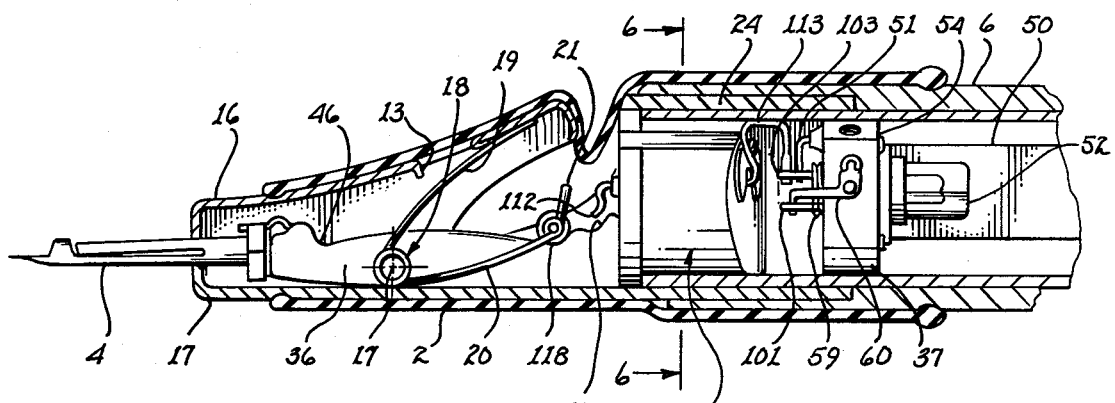
fig. 5
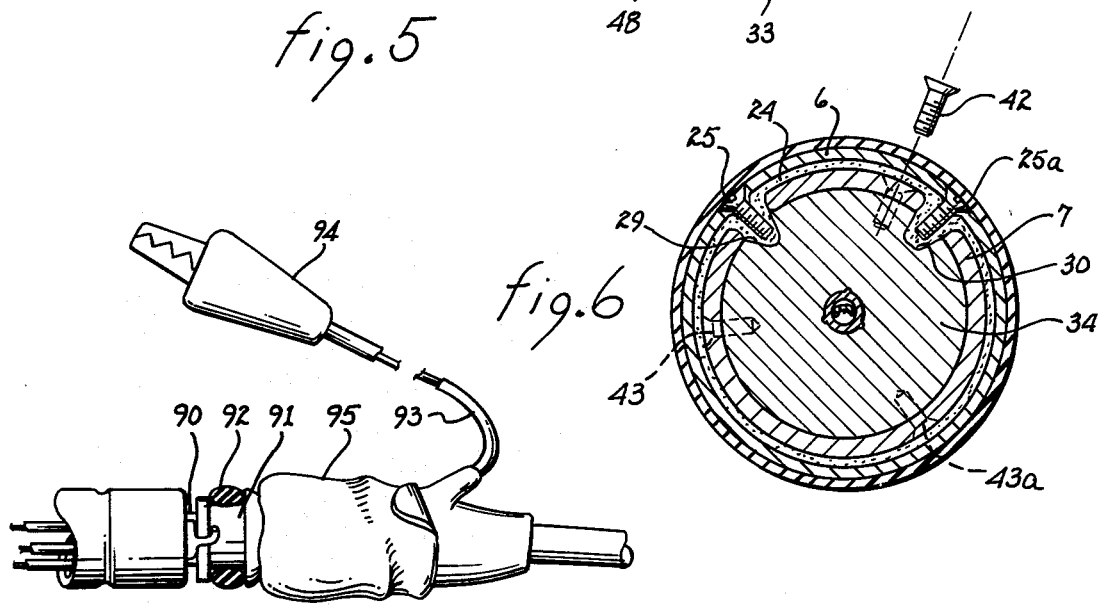
fig. 6
fig. 7
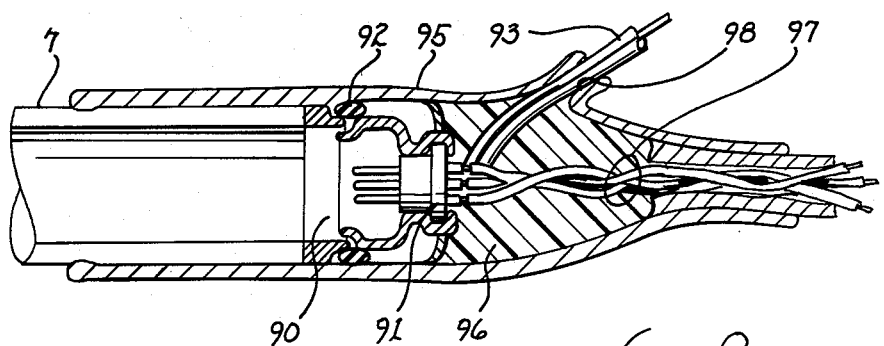
fig. 8

ELECTRICAL TEST PROBE HAVING A SPRING BIASED CLIP WITH AN EXTENDABLE AND RETRACTABLE TIP MOVABLE WITHIN THE CLIP

The present invention relates to electrical testing equipment and, more particularly, to universally useable electrical probes with multiple operative modes.

Electrical probes for testing purposes or for temporarily interconnecting electrical points have been available for a number of years. Most of these devices include either spring biased clips or solid tips which extend from an insulated housing. The housing may be a simple mechanical structure, the primary purpose of which is to encapsulate and insulate the electrical connection intermediate the operative element of the probe and an attached electrical conductor; or, the housing may include specially configured circuitry integrally mounted within the housing and intended for use in conjunction with predetermined characterized electrical signals.

U.S. Pat. No. 2,918,646, describes a probe having an uninsulated spring biased clip extending from within an insulating housing. An extendible probe tip in the shape of a rod with a pointed end is selectively extendible through the teeth of the clip in order to make contact with a point inaccessible to the clip itself. Neither the clip nor the tip are insulated and manual contact with the tip extending mechanism necessarily subjects the operator to the potential of shock or subjects the attached testing or recording apparatus to an electrical input from the body of the operator. U.S. Pat. No. 3,182,257, describes an electrical probe having a spring biased clip, which, in the closed position, defines a relatively blunt tip. The housing for the probe encompasses a plurality of levers, cams, and spring bias means for selectively opening and closing the clip. Other U.S. patent illustrating various types and configurations of probes includes Nos.: 1,615,788; 2,654,076; 2,849,681; 2,857,572; 2,894,205; 2,934,738; 3,265,969; 3,374,455; 3,522,533; 3,612,999; and 3,821,689.

It is therefore a primary object of the present invention to provide an electrical probe having a spring biased toothed clip and a selectively slidable tip extendible external to the teeth of the clip by telescoping action of concentric sleeves forming the body of the probe.

Another object of the present invention is to provide an extendible tip for a test probe, which tip, in the retracted position, leaves unimpeded the spring biased clip of the probe.

Yet another object of the present invention is to provide a test probe having an extendible tip, the operation of which is effected by slidable retraction and extension of concentric sleeves of the housing for the probe.

Still another object of the present invention is to provide an electrical test probe having the operative elements coated with an insulating material to permit use within confined space without fear of short circuiting live electrical elements in proximity to the test point or between the elements and the operator.

A further object of the present invention is to provide a housing for receiving interchangeable circuit modules to act upon the signal sensed by the probe.

A yet further object of the present invention is to provide mechanically rigid and electrically conducting disconnect means for detachably attaching the probe to an electrical conductor.

A still further object of the present invention is to provide an electrical probe with an extendible tip retained in place by a spring biased detent roller, which tip is configured to engage a terminal post of a circuit board or terminal.

A still further object of the present invention is to provide apparatus for checking the electrical continuity through the probe.

These and other objects of the present invention will become apparent to those skilled in the art as the description thereof proceeds.

The present invention will be described with greater specificity and clarity with reference to the following drawings, in which:

FIG. 1 is a perspective view of the test probe showing the tip in the extended position.

FIG. 2 is a partial cross-sectional view of the test probe and showing various internal construction features.

FIG. 2a is an exploded view of the elements internal to the test probe sleeves.

FIG. 2b is a partial cross-sectional view taken along lines 2b—2b, as shown in FIG. 2a.

FIG. 3 is a cross-sectional view taken along lines 3—3, as shown in FIG. 2.

FIG. 4 is a partial cross-sectional view of the tip.

FIG. 5 is a partial cross-sectional view of the test probe showing the tip in the extended position.

FIG. 6 is a cross-sectional view taken along lines 6—6, as shown in FIG. 5.

FIG. 7 is a partial view illustrating a variant interconnection between the test probe and attached electrical conductors.

FIG. 8 is a partial cross-sectional view of the variant illustrated in FIG. 7.

The major components of test probe 1 are depicted in FIG. 1 and include an insulating boot 2 of elastic material for encapsulating the major part of clip 3 and the operative elements for tip 4. Housing 5 of the test probe includes a sleeve 6 and a slidably mating concentric sleeve 7; both sleeves being of insulating material. A flexible insulating cap 8 extends from about the rear end of sleeve 7 to circumscribe electrical conductor 9 and serves as a strain relief to preclude excessive bending of the conductor at its point of egress from housing 7. As illustrated, and identified by numerals 10 and 11, the exterior surface of sleeves 6 and 7 may be ribbed or knurled to provide better gripping of the respective sleeves.

The internal structure details of test probe 1 will be described with primary reference to FIGS. 2, 2a, 2b, 3, 4, 5 and 6. Clip 3 includes a base element 15 having teeth 22 and a pivotable element 16 having teeth 23 connected to one another at pivot points 17 and allowing the teeth to mate with one another. A spring 18, having arms 19 and 20, biases the clip elements into the closed configuration. Arms 20, 20a (see FIG. 2a) also support a roller 118 which is electrically conducting. Additionally, a bar 21, which may be attached to or developed as part of arms 20 and 20a extend across and above roller 118. The purpose and function of bar 21 will be discussed in further detail below. The exposed external surfaces of clip 3, base element 15 and pivotable element 16, may be coated with plastic insulating material such as that sold under the trademark "Teflon". Base element 15 extends rearwardly, or to the right, and is developed into a cylindrical configuration or section 24 juxtaposed with the interior surface of sleeve 6. Two nonconductive flat head bolts 25, 25a (located about 30° on either side of the top vertical center—see FIG. 6), extend through the sleeve and threadedly engage a threaded aperture within cylindrical section 24 of base element 15 to retain the base element in rigid relationship to sleeve 6.

A cylindrical block 33 is slidably disposed internal to cylindrical section 24 and sleeve 6. The forward, or left hand end of block 33 is configured to represent a ram 36 with indented cam surfaces 46, 47 and 48. A threaded cavity is disposed at the tip of the ram to threadably receive threaded shank 38 of tip 4 (see FIG. 4). A downwardly extending spring element or clip 27 is secured to the bottom surface of ram 36 for mating engagement with a groove 28 disposed in base element 15. The block is configured as a cylindrical section 34 having a radially extending annular flange 35 butting against the edge of sleeve 7 and bearing against the inner surface of cylindrical section 24. Toward the rear, the block is partially cut away to define a compartment intermediate section 34 and apertured disc 37 having a flat edge 40.

Block 33 is affixed to the interior surface of sleeve 7 by means of a plurality of nonconductive flat head machine bolts 41, 43 and 43a. Bolt 42 is at the top of the vertical center of sleeve 6 and bolts 43, 43a are located forward about 120° on either side from bolt 42 (see FIG. 6). Accordingly, sliding movement intermediate sleeves 6 and 7 results in commensurate repositioning of block 33 within sleeve 6 while rotation of the block is restrained by interaction between clip 27 and groove 28. Additionally, bolts 25, 25a, securing sleeve 6 with section 24, may be extended to slidably mate with aligning grooves 29, 30 in block 33 to preclude rotation of the block. Moreover, the sliding movement of block 33 and ram 36 results in commensurate repositioning of tip 4 with respect to clip 3. The extent of normal rearward and forward movement of block 33 is restrained and keyed by arms 20, 20a supporting roller 118 engaging cam surface 46 located at the forward end of ram 36 and cam surface 47 located at the rear end of the ram. As will be discussed below, further forward movement of the ram can be effected by forcing roller 118 onto cam surface 48. Thusly, in the configuration shown in FIG. 2, tip 4 is in the retracted position and urgingly maintained thereat by roller 118 being biased into engagement with cam surface 46.

A bracket 50 is disposed internal to sleeve 7 and includes a flange 51 for supporting various electrical elements, such as fuse holder 49 for spare fuse 53, and a baffle 54 for supporting electrical elements or circuitry, such as fuse holder 59 and fuse 52. The flange is positionally oriented within sleeve 7 by means of a keying pin 55 extending into hole 56 in disc 37 and insulated from the disc by conically shaped insulation 57. The baffle is insulated from the disc by a non-electrically conductive washer 58. Bracket 50 is secured to disc 37 by means such as three non-conductive pan head machine bolts 63, 64 and 65 extending from the baffle into threaded engagement with the rear end of the disc. In the alternative, the electrical element (fuse 52 and fuse holder 59) may threadedly engage aperture 62 and be constrained against rotation by tabs of the bracket. Electrical conductor 9 extends from flange 51 through wire contoured bracket clamp 79 and opening 68 disposed at the rear of sleeve 7. The conductor may have all the insulation removed from the conductor knot to clamp 79 in order to maintain more easily the slack within the sleeve. A soft rubber washer 69 may also be incorporated for strain relief purposes.

Clip 3 is electrically conducting to convey the electrical signal sensed by the probe. Similarly, block 33 is of electrically conducting material and the wiping action of the block against the adjacent surfaces of cylindrical section 24 of element 15 due, in part, to the pressure exerted by arms 20, 20a of spring 18 and spring 27 against base element 15 assures continuing low resistance electrical continuity. Tip 4 is of electrically conducting material and establishes a low resistance junction intermediate ram 36 and the shank of the tip by means of the mating threads. A resilient contact arm 60 is secured and keyed to edge 40 of disc 37 by screw means 61 and extends into the compartment intermediate section and disc 37 and into proximity with aperture 62 in the disc. The arm is either slidably or permanently electrically connected to an electrical conductor extending into the compartment from the circuitry attached to bracket 50. Thereby, an electrical path intermediate block 33 and bracket 50 is established through contact arm 60 and the circuitry. In the example illustrated in FIG. 2, conductor 101 of fuse holder 59 is secured to arm 60 through electrical link 102, and conductor 103 of the fuse holder is connected through electrical link 104, pin 55 and rear end 113 of conductor 110. As described above, bracket 50 is electrically and mechanically connected to conductor 9 by means, such as bolted contour bracket 79. It is to be understood that circuitry, either passive or active circuitry other than fuse 52, could be employed to act upon or otherwise affect the electrical signal sensed by the probe.

Considering FIGS. 3 and 4 specifically, the construction of tip 4 will be described in further detail. The tip includes a sharpened point 80 to provide the capability of making contact with extremely small sized surfaces or for the purpose of piercing insulation surrounding an element to be probed. A passageway 81 is disposed in proximity to the end of the tip to receive a post or similar electrical conductor extending from a circuit board or the like. Spring arm 82 slidably and retainingly contacts the surface of a post inserted through passageway 81 to constrain disengagement of the post from within the passageway. Shoulder 83 of the tip butts against the forward edge of ram 36 to insure threaded locking of shank 38 within the ram. Additionally, a keying pin 84 may extend forwardly from the ram for lockingly engaging one of a plurality of grooves 85 disposed transverse to shoulder 83. A spring washer 86 disposed intermediate the shoulder and the ram exerts a bias force against tip 4 even though the latter may not be tightly screwed into the ram. By this keying mechanism, the tip may be rotated about its longitudinal axis to conform with or otherwise render more ready access to the electrical point to be tested without rotation of the probe itself.

To insure continuing operability of probe 1 and preclude erroneous signal transmission, or lack thereof, through conductor 9, the probe may include means for checking the electrical continuity through the electrical components. The electrical continuity test apparatus will be described with primary reference to FIGS. 2, 2a and 2b. A conductor 110 is disposed within an insulating sleeve centrally located in block 33. The forward end 112 of the conductor is bent downwardly toward but not in contact with cam surface 48. The rear end 113 of the conductor extends upwardly adjacent the near surface of cylindrical section 34 and is secured thereto by non-electrically conducting bolt of screw 114. An insulating marker 115 or the like, electrically segregates the end 113 from the adjacent surface of cylindrical section 34. End 113 is terminated and electrically attached to conductor 103 extending from fuse 52 or fuse holder 59 fo the fuse. As pointed out above, conductor 103 is electrically connected to conductor 9.

Upon insertion of sleeve 7 into sleeve 6, roller 118 is forced first into engagement with cam surface 47 and if the force exerted is sufficient, into engagement with cam surface 48. On seating roller 118 upon cam surface 48, end 112 will come into electrical contact with bar 21 extending across the roller. In the alternative, electrically conducting roller 118 may contact end 112 directly. Preferably, end 112 is slightly resiliently displaced to insure a good electrical contact. Thereby, a continuous electrical path, which bypasses the electrical element (fuse 52) or circuitry mounted on bracket 50, will exist between clip 3 and conductor 9. Cam surface 48 may be configured to require continuous compressive force between sleeves 6 and 7 in order to maintain roller 118 lodged thereon and thereby preclude inadvertent electrical bypass of fuse 52. In the event an electrical path is not present, as determined by a continuity meter or ohm meter, a presumption may be made that a malfunction exists in the probe.

Boot 2, encasing clip 3, precludes an electrical path between an operator and the clip or another electrical potential point. By being elastic, the boot will not inhibit or otherwise restrain the pivoting action of the clip elements during engagement and disengagement of the clip with an element to be probed or clipped.

To facilitate operation of probe 1, various color coded bands may encircle sleeve 7 to depict different modes of operation. These bands would be located so as to be selectively covered by sleeve 6 except upon full extension or retraction of ram 36 and during a continuity check of the probe.

To separate sleeves 6 and 7, roller 118 is disengaged from cam surface 46 and the ram is withdrawn. Such disengagement is facilitated by inserting a screwdriver or similar tool through aperture 13 within pivotable element 16 of clip 3 and lifting upon bar 21 above roller 118 and simultaneously slidably withdrawing the ram from sleeve 6 by withdrawing sleeve 7 from within sleeve 6. Necessarily, boot 2 must be peeled back to provide access to aperture 13.

Depending upon the type and nature of the circuitry attached to and/or supported by bracket 50 within sleeve 7, the number of electrical conductors extending from the probe may be more than one. To lend versatility to the probe, a multipin connector, such as connector 90 illustrated in FIG. 7 and 8, may be permanently attached to the rear end of sleeve 7. A mating connector 91 is detachably attached to connector 90. An O-ring or spacer 92 may be employed to maintain cylindrical continuity intermediate the male and female connectors. A flexible cylindrical covering 95 of insulating material (shown peeled back in FIG. 7) is positionable to envelope and insulate the connectors. Potting compound 96, as illustrated in FIG. 8, may be deposited within covering 95 in proximity to the terminals extending from connector 91 to shield and protect the extending electrical conductors 97. For special purposes, an insulated entryway 98 may be formed within covering 95 to permit access of a grounding wire 93 and attached clip 94 to the electrical ground of connector 91. Appropriate threaded elements or other locking elements may be secured to the casing of the connector to insure electrical continuity between the casing and the ground wire during manipulation of the probe.

In operation, clip 3 of probe 1 is deployed in the conventional manner to secure electrical and mechanical connection intermediate the probe and the element to be tested. For locations wherein the clip is inadequate, too bulky, or otherwise inappropriate, tip 4 is extended through the clip by slidably forcing sleeve 7 into sleeve 6. The resulting translation of block 33 and extending ram 36 forces the tip outwardly through the teeth of the clip (after the latter have been opened) until roller 118 drops into and engages cam surface 47 of the ram. Simultaneously, clip 3 is manually released to allow the coil spring to bias the teeth of the base and pivotal elements of the clip toward one another and grip the shank of the tip in position intermediate the teeth. The action of the teeth, in combination with the locking effect of cam surface 47 upon roller 118, will maintain the tip in the extended position for all normal expected uses. To retract the tip, the base and pivotal elements of the clip are manually separated from one another by squeezing the clip and sleeve 7 is withdrawn from within sleeve 6. The resulting movement will disengage roller 118 from cam surface 47 and ultimately reengage the roller with cam surface 46 at the front end of ram 36. The positioning or locking action effected by roller 118 being disposed within cam surface 46 will maintain the tip contained within the bowels of clip 3 to preclude interference during normal use of the clip.

to repair, alter, or replace the circuitry secured to bracket 50, sleeve 7 is pulled apart from within sleeve 6, which action is restrained, but not inhibited, by engagement of roller 118 with cam surface 46. After sleeve 7 has been disengaged from within sleeve 6, bolts 42, 43 and 43a are unscrewed to release block 33 from sleeve 7 and the block is withdrawn from within the sleeve to the extent of the slack conductor accumulated within the sleeve. On withdrawal of the block, bracket 50 being attached thereto, is also withdrawn and may be detached by unscrewing bolts 63, 64 and 65. After bracket 50 has become accessible, the appropriate repairs, alterations or replacement of the attached circuitry may be effected. Reassembly of the probe is effected by reversing the above described steps.

While the principles of the invention have now been made clear in an illustrative embodiment, there will be immediately obvious to those skilled in the art many modifications of structure, arrangement, proportions, elements, materials, and components, used in the practice of the invention which are particularly adapted for specific environments and operating requirements without departing from those principles.

I claim:
1. An electrical probe for determining the presence and absence of an electrical signal at a predetermined potential source of electrical energy, said probe comprising:
 a. a housing, said housing including a first sleeve and a second sleeve, said second sleeve being concentric with and slidably translatable with respect to said first sleeve;
 b. an electrically conductive clip for gripping and contacting the electrical source, said clip having a pivotable element and a base element, which base element is secured to said first sleeve and including electrically conductive spring means for biasing the pivotable element of said clip toward said base element of said clip;

c. an extendible electrically conductive tip secured to said second sleeve for making a point contact with the electrical source, said tip being retractable within an envelope defined by the pivotable element and the base element and extendible from within the envelope;

d. an electrically conductive block and an electrically conducting ram extending from said block for supporting said tip, said block being affixed to said second sleeve and disposed intermediate said second sleeve and said tip for imparting the translational movement of said second sleeve with respect to said first sleeve to said tip and extend said tip from within the envelope;

e. an electrically conductive roller supported by said spring means for slidably bearing against a surface of said ram; and f. first and second cam surfaces disposed upon the surface of said ram for alternately receiving said roller, said first cam surface being located to receive said roller when said tip is retracted and said second cam surface being located to receive said roller when said tip is extended; whereby, said roller secured to and supported by said spring means aids in maintaining said tip retracted and extended and aids in maintaining electrical and mechanical contact between said roller and said block;

g. electrical conductor means in electrical communication with said block for conveying an electrical signal present at the electrical source;

whereby, sliding movement of said second sleeve relative to said first sleeve results in commensurate extension and retraction of said tip out of and into said clip.

2. The probe as set forth in claim 1 wherein said tip includes a point for penetrating insulation disposed over the electrical source to be tested.

3. The probe as set forth in claim 2 wherein said tip includes a passageway for engaging a post representative of the electrical source.

4. The probe as set forth in claim 3 wherein said tip further includes spring arm means for restraining withdrawal of the post disposed within said passageway.

5. The probe as set forth in claim 4 including threaded means for securing said tip to said ram.

6. The probe as set forth in claim 5 including keying means for positionally orienting rotation of said tip with respect to said block.

7. The probe as set forth in claim 1 including bracket means disposed within said second sleeve for supporting electrically responsive circuitry within said second sleeve, said circuitry electrically interconnecting said block and said conductor means.

8. The probe as set forth in claim 7 wherein said conductor means includes mating connection means for electrically connecting said circuitry with an electrical cord, said connector means comprising a first connector secured to said second sleeve and a second connector electrically secured to the electrical cord; whereby, said probe is disconnectable from the electrical cord.

9. The probe as set forth in claim 1 including bracket means disposed within said second sleeve for supporting electrically responsive circuitry within said second sleeve, said circuitry electrically interconnecting said block and said conductor means.

10. The probe as set forth in claim 9 wherein said bracket means includes a baffle for securing said bracket to said block.

11. The probe as set forth in claim 9 further including insulation means disposed upon the exterior surface of said clip for electrically insulating said clip from electrically energized components located lateral to said clip.

12. The probe as set forth in claim 9 wherein said conductor means includes mating connection means for electrically connecting said circuitry with an electrical cord, said connector means comprising a first connector secured to said second sleeve and a second connector electrically secured to the electrical cord; whereby, said probe is disconnectable from the electrical cord.

13. The probe as set forth in claim 12 including an insulating covering positionable about said connector means for electrically insulating the external surface of said connector means.

14. The probe as set forth in claim 7 wherein said block comprises a cylindrical section, a disc attached to said cylindrical section and a compartment disposed intermediate said cylindrical section and said disc for receiving elements of said circuitry.

15. The probe as set forth in claim 14 wherein said bracket means is attached to and insulated from said disc.

16. The probe as set forth in claim 7 including a continuity test apparatus, said apparatus comprising:

a. a third cam surface disposed upon the surface of said ram for receiving said roller, said third surface being disposed in proximity to said second cam surface;

b. a conductor disposed within and extending from said block, said conductor including a first end terminating in proximity to said third cam surface for electrically contacting said roller upon engagement of said roller with said third cam surface and a second and electrically connected to said conductor means for electrically bypassing said circuitry; and c. insulation means for electrically isolating said conductor from said block;

whereby, on engagement of said roller with said third cam surface an electrical path bypassing said circuitry is established intermediate said tip and said conductor means.

17. The probe as set forth in claim 16 wherein said apparatus includes an electrically conductive bar extending across and above said roller for mechanically and electrically contacting said first end of said conductor.

18. The probe as set forth in claim 17 wherein said bar of said apparatus comprises an extension of said spring means.

19. The probe as set forth in claim 1 including an aperture disposed in said pivotable element of said clip for accommodating insertion of a tool therethrough to raise said roller of the surface of said ram.

* * * * *

UNITED STATES PATENT AND TRADEMARK OFFICE
CERTIFICATE OF CORRECTION

PATENT NO. : 4,151,462
DATED : April 24, 1979
INVENTOR(S) : A. Lee Teyler

It is certified that error appears in the above-identified patent and that said Letters Patent are hereby corrected as shown below:

In column 8, Claim 19, line 4, delete "of" (first occurrence) and substitute therefor --off--.

Signed and Sealed this

Thirteenth Day of January 1981

[SEAL]

Attest:

SIDNEY A. DIAMOND

Attesting Officer      *Commissioner of Patents and Trademarks*